(12) United States Patent
Kunkle

(10) Patent No.: US 7,869,211 B2
(45) Date of Patent: Jan. 11, 2011

(54) ELECTRONIC MODULE CONFIGURED FOR FAILURE CONTAINMENT AND SYSTEM INCLUDING SAME

(75) Inventor: Jonathan Kunkle, Irwin, PA (US)

(73) Assignee: Siemens Industry, Inc., Alpharetta, GA (US)

( * ) Notice: Subject to any disclaimer, the term of this patent is extended or adjusted under 35 U.S.C. 154(b) by 244 days.

(21) Appl. No.: 11/769,891

(22) Filed: Jun. 28, 2007

(65) Prior Publication Data

US 2009/0016018 A1  Jan. 15, 2009

Related U.S. Application Data

(60) Provisional application No. 60/818,081, filed on Jun. 30, 2006.

(51) Int. Cl.
H05K 7/20 (2006.01)
H02B 1/26 (2006.01)

(52) U.S. Cl. .................. 361/695; 361/648; 361/676; 361/678; 361/694; 361/702

(58) Field of Classification Search ............... 361/695, 361/609, 611, 622, 648, 690, 697, 726
See application file for complete search history.

(56) References Cited

U.S. PATENT DOCUMENTS

| | | | |
|---|---|---|---|
| 3,415,583 A | | 12/1968 | Zucker |
| 4,027,206 A | * | 5/1977 | Lee .............................. 361/697 |
| 5,335,143 A | | 8/1994 | Mailing, Jr. et al. |
| 5,625,545 A | | 4/1997 | Hammond |
| 5,680,294 A | * | 10/1997 | Stora et al. ................... 361/695 |
| 5,831,847 A | * | 11/1998 | Love ........................... 363/141 |
| 5,930,112 A | | 7/1999 | Babinski et al. |
| 6,046,921 A | * | 4/2000 | Tracewell et al. ........... 363/141 |
| 6,081,423 A | * | 6/2000 | Griffin ......................... 361/688 |
| 6,400,566 B1 | * | 6/2002 | Ootori ......................... 361/695 |
| 7,019,996 B2 | * | 3/2006 | Zhu et al. .................... 363/144 |
| 7,120,018 B2 | * | 10/2006 | Shen et al. ................... 361/695 |
| 7,180,739 B2 | * | 2/2007 | Kajiura ........................ 361/695 |
| 7,313,000 B2 | * | 12/2007 | Fiorentino et al. .......... 361/752 |
| 2004/0007347 A1 | | 1/2004 | Stoller |
| 2004/0252460 A1 | | 12/2004 | Strauss |
| 2005/0146851 A1 | | 7/2005 | Kajiura |
| 2005/0286231 A1 | | 12/2005 | Kishi |
| 2007/0030649 A1 | | 2/2007 | Tsai et al. |
| 2008/0304235 A1 | * | 12/2008 | Kunkle ........................ 361/697 |

FOREIGN PATENT DOCUMENTS

| | | |
|---|---|---|
| EP | 0356991 A2 | 3/1990 |
| EP | 0356991 A3 | 3/1990 |

* cited by examiner

*Primary Examiner*—Anatoly Vortman
(74) *Attorney, Agent, or Firm*—Filip A. Kowalewski

(57) ABSTRACT

An electronic module. The electronic module includes a chassis, a plurality of capacitors, and a heat sink. The chassis includes a first end and a second end. The first end is opposite the second end. The chassis also includes a first side, a second side, a third side, and a fourth side. The second side is opposite the first side. The third side is connected to at least one of the first and second sides. The fourth side is connected to at least one of the first and second sides, and is opposite the third side. The chassis is fabricated from a material which stops component debris from passing through the sides of the chassis. The capacitors are positioned within the chassis. The heat sink is positioned between the capacitors and the second end.

20 Claims, 5 Drawing Sheets

ELECTRONIC MODULE CONFIGURED FOR FAILURE CONTAINMENT AND SYSTEM INCLUDING SAME

CROSS-REFERENCE TO RELATED APPLICATION

This application claims the priority benefit of U.S. Provisional Patent Application Ser. No. 60/818,081, filed on Jun. 30, 2006. This application is related to U.S. patent application Ser. No. 11/769,846, filed Jun. 28, 2007, entitled "Electronic Module Configured for Air Flow Therethrough and System Including Same", to U.S. patent application Ser. No. 11/769,782, filed Jun. 28, 2007, entitled "Electronic Module Having a Locking Member and System Including Same", and to U.S. patent application Ser. No. 11/769,804, filed Jun. 28, 2007, entitled "Electronic Module and Interlocking Bus System Including Same".

Not Applicable

BACKGROUND

This application discloses an invention that is related, generally and in various embodiments, to an electronic module configured for failure containment.

Electronic modules come in a variety of shapes, sizes and configurations, and are utilized in a wide range of applications. For example, in some applications, the electronic modules form portions of a power supply, accept a three-phase AC input power, and output a single phase AC voltage. Such electronic modules include internal components which generate a measurable amount of heat, and such heat can affect the performance of the respective components and the electronic module itself.

In many applications, the amount of heat generated causes certain components to fail. For example, it is known for capacitors to fail to due increased temperatures. Such failures can result in an explosion, and debris from the explosion can cause significant damage not only to the electronic module, but to other devices near the electronic module.

SUMMARY

In one general respect, this application discloses an electronic module. According to various embodiments, the electronic module includes a chassis, a plurality of capacitors, and a heat sink. The chassis includes a first end and a second end. The second end is opposite the first end. The chassis also includes a first side, a second side, a third side, and a fourth side. The second side is opposite the first side. The third side is connected to at least one of the first and second sides. The fourth side is connected to at least one of the first and second sides, and is opposite the third side. The chassis is fabricated from a material which stops component debris from passing through the sides of the chassis. The capacitors are positioned within the chassis. The heat sink is positioned between the capacitors and the second end.

In another general respect, this application discloses a system. According to various embodiments, the system includes a fan and an electronic module. The electronic module includes a chassis, a plurality of capacitors, and a heat sink. The chassis includes a first end and a second end. The second end is opposite the first end. The chassis also includes a first side, a second side, a third side, and a fourth side. The second side is opposite the first side. The third side is connected to at least one of the first and second sides. The fourth side is connected to at least one of the first and second sides, and is opposite the third side. The capacitors are positioned within the chassis. The heat sink is positioned between the capacitors and the second end, and is positioned such that when the fan generates an airflow, the airflow carries component debris toward the heat sink.

DESCRIPTION OF DRAWINGS

Various embodiments of the invention are described herein by way of example in conjunction with the following figures.

DETAILED DESCRIPTION

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Figure 1:
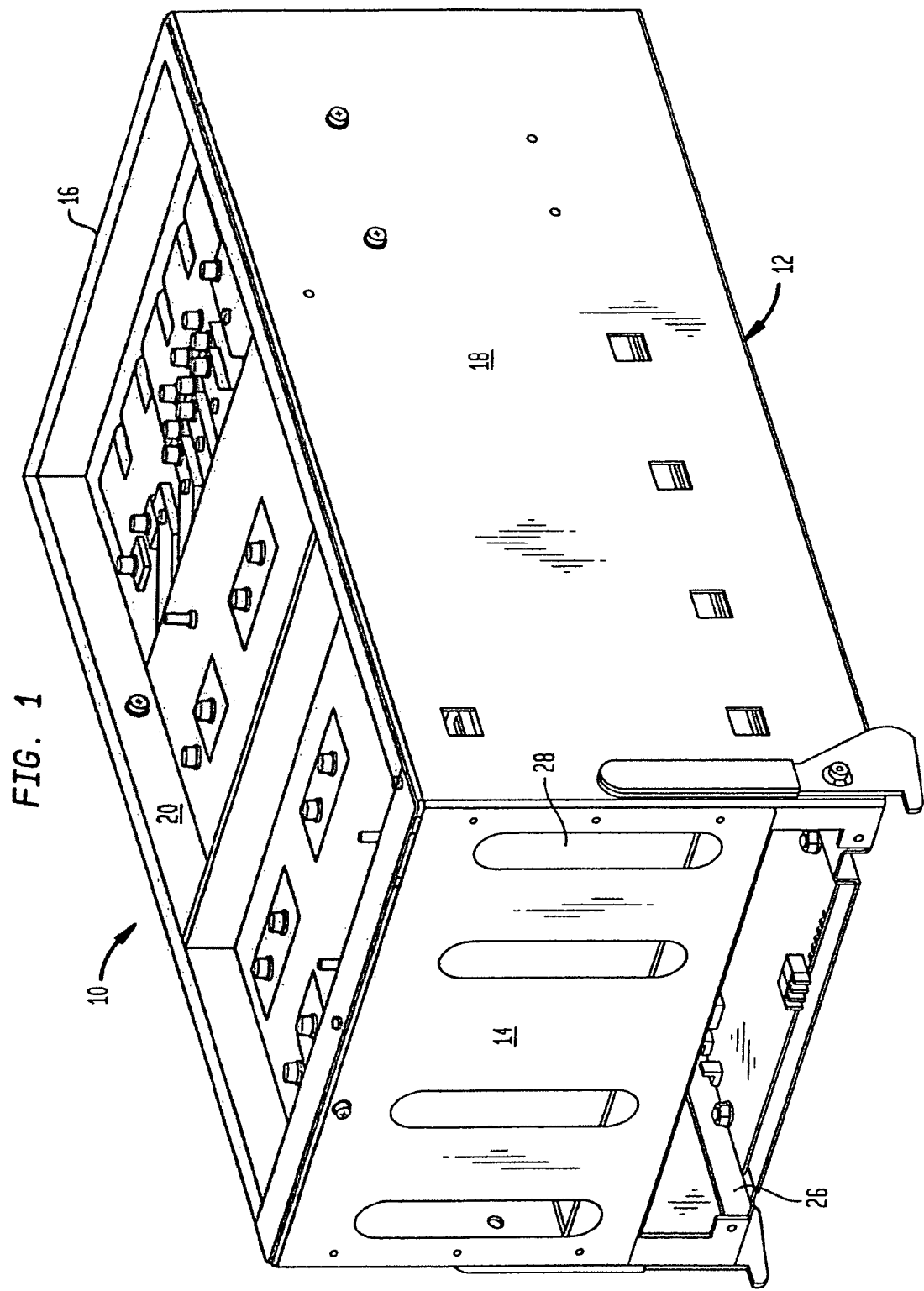
FIG. 1 illustrates various embodiments of an electronic module.
Figure 2:
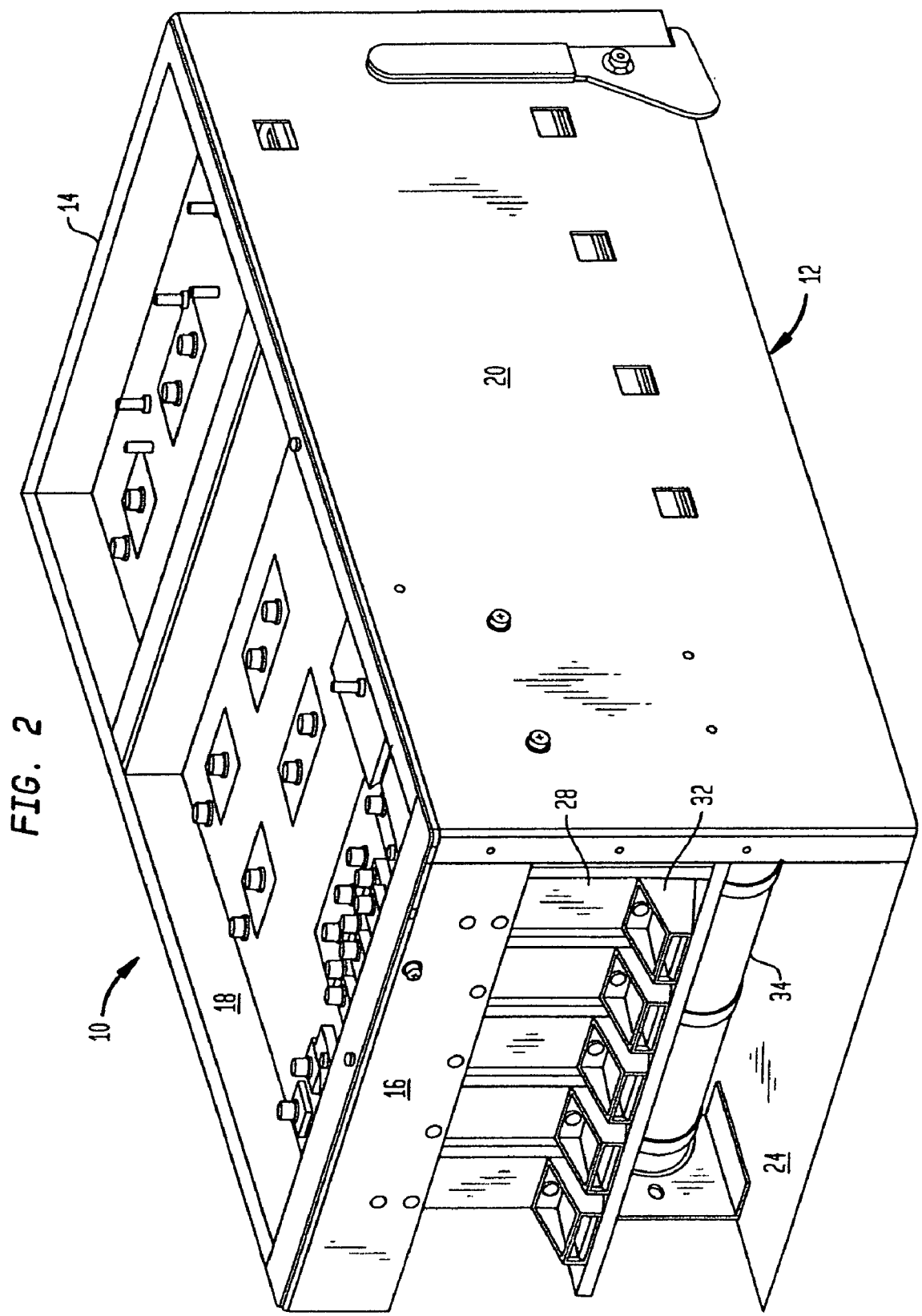
FIG. 2 illustrates various embodiments of the electronic module of FIG. 1 including a plurality of bus bars.

FIG. 1 and FIG. 2 illustrate various embodiments of an electronic module 10. The electronic module 10 may be implemented as any type of module such as, for example, a power cell, a power supply, an inverter, a drive chassis, etc. According to various embodiments, the electronic module 10 is implemented as a power cell which accepts three phase AC input power and outputs a single phase AC voltage. Such a power cell is described in U.S. Pat. No. 5,625,545 (Hammond), and includes an AC-to-DC rectifier, a smoothing circuit, an output DC-to-AC converter, and a control circuit.

The electronic module 10 includes a chassis 12 having a first end 14 and a second end 16 which is opposite the first end 14. The first end 14 may be considered the "front" of the electronic module 10. The second end 16 is opposite the first end 14 and may be considered the "back" of the electronic module 10. According to various embodiments, the chassis 12 may be comprised of several portions connected together (e.g., a top, a bottom, and four sides), and one or more portions of the chassis 12 may be removable. The chassis 12 defines an exterior portion of the electronic module 10, and encloses various components (e.g., any or all of the following: capacitors, printed circuit boards, heat sink, switching devices, resistors, etc.) of the electronic module 10. The chassis 12 may be fabricated from any suitable material. For example, according to various embodiments, the chassis 12 is fabricated from a conductive material such as a metal (e.g., galvanized steel). For such embodiments, the conductive material of the chassis 12 may serve to provide a low impedance path for arcing faults within the chassis 12 to minimize potential damage caused thereby. The chassis 12 may be of a thickness sufficient to stop any debris resulting from a failure of an internal component of the electronic module 10 from exiting the space enclosed by the chassis 12, thereby preventing any collateral damage to other components in the vicinity of the electronic module 10. In addition, the chassis 12 may serve to protect internal components of the electronic module 10 from damage during shipping and handling, and may be configured in a manner such that the electronic module 10 can be placed on any of its sides without causing any damage to the components of the electronic module 10. Furthermore, as described in more detail hereinbelow, the chassis 12 may also define an air plenum utilized to assist in the forced air cooling of all components within the chassis 12.

The chassis 12 also includes a first side 18, a second side 20, a third side 22 (see FIG. 3), and a fourth side 24. The first side 18 may be considered the "right" side of the chassis 12. The second side 20 is opposite the first side 18, and may be considered the "left" side of the chassis 12. The third side 22 is connected to at least one of the first and second sides 18, 20, and may be considered the "top" of the chassis 12. For purposes of clarity, the electronic module 10 is shown having the third side 22 removed in FIG. 1 and FIG. 2. The fourth side 24 is opposite the third side 22, is connected to at least one of the first and second sides 18, 20, and may be considered the "bottom" of the chassis 12. The sides of the chassis are fabricated from a material (e.g., galvanized steel) which stops component debris from passing therethrough. As shown in FIG. 1, the first end 14 defines an opening 26 proximate the fourth side 24, and also defines one or more openings 28 proximate the opening 26. Collectively, the first and second ends 14, 16, and the first, second, third, and fourth sides 18, 20, 22, 24 of the chassis 12 enclose substantially the entire electronic module 10.

As shown in FIG. 2, the electronic module 10 includes a plurality of bus bars 30 positioned within the chassis 12 proximate the second end 16, a plurality of power plug connectors 32 positioned proximate the second end 16, and a plurality of resistors 34 positioned proximate the second end 16. The resistors 34 are electrically connected to capacitors of the electronic module 10, and function to bleed current from the capacitors when power to the electronic module 10 is interrupted or shut down.

The bus bars 30 may be fabricated from any suitable conductive material, and are collectively configured to route power to and from the electronic module 10. For this embodiment, at least two of the bus bars 30 are configured as input bus bars and at least two of the bus bars 30 are configured as output bus bars. The number, size and shape of the bus bars 30 can vary by application. In general, the respective bus bars 30 are sized to accommodate requirements associated with a particular application.

According to various embodiments, each power plug connector 32 includes a conductive material and a housing which surrounds the conductive material. The conductive material may be fabricated from any suitable conductor such as, for example, copper. The housing may be fabricated from any suitable insulating material such as, for example, a plastic. The housing defines an opening configured to receive a portion of a system bus when the electronic module 10 is connected to a system bus. The opening surrounds the conductive material, and the conductive material defines a smaller opening configured to receive the portion of the system bus when the electronic module 10 is connected to the system bus. Thus, the housing and the conductive material collectively define an opening which is sized to receive the portion of the system bus when the electronic module 10 is connected to the system bus.

As shown in FIG. 2, the power plug connectors 32 are connected to corresponding bus bars 30. A given power plug connector 32 may be connected to a corresponding bus bar 30 in any suitable manner. For example, according to various embodiments, the power plug connector 32 is mechanically connected to the bus bar 30 via fasteners (e.g., screws or nuts and bolts) in a manner that places the conductive material in direct contact with the bus bar 30. Thus, the bus bar 30 may also act as a heat sink for the power plug connector 32 connected thereto. The power plug connector 32 is configured such that it can be connected to the bus bar 30 in a manner that the permits some movement of the power plug connector 32.

According to other embodiments, the power plug connectors may be configured in a different manner. For example, according to various embodiments, a given power plug connector may include a male portion and a separate female portion which collectively function to connect the electronic module 10 to the system bus. For some embodiments, the male portion is connected to the corresponding bus bar and the female portion is connected to the system bus. In other embodiments, the male portion is connected to system bus and the female portion is connected to the corresponding bus bar. In general, for a given application, the particular configuration of power plug connectors are selected to accommodate requirements associated with a particular application.

Figure 3:
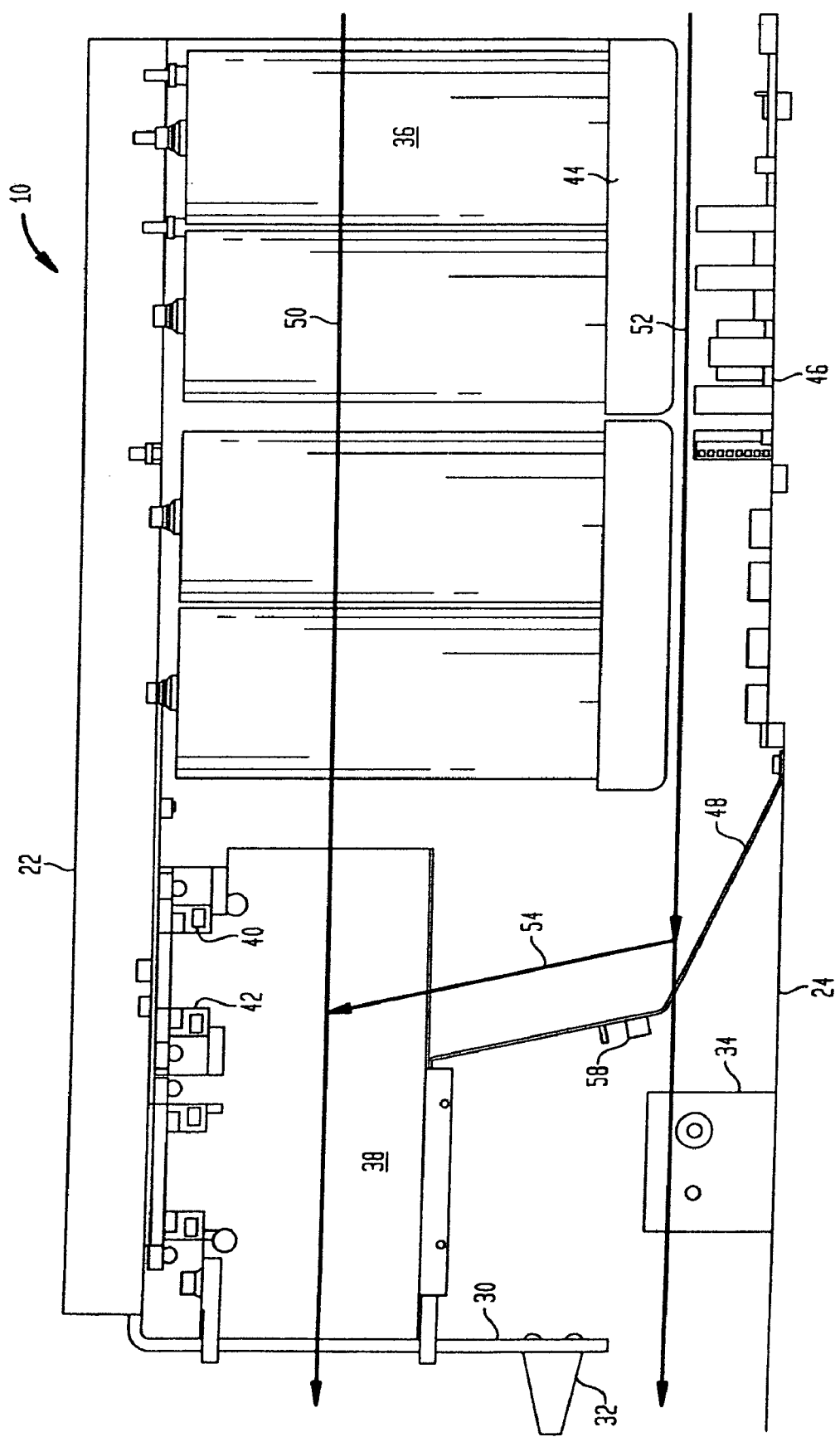
FIG. 3 illustrates a cross-sectional view of the electronic module of FIG. 1.

FIG. 3 illustrates a cross-section of the electronic module 10 according to various embodiments. As shown in FIG. 3, the electronic module 10 also includes a plurality of capacitors 36, a heat sink 38, a first switching device 40, a second switching device 42, one or more capacitor trays 44, a control board 46, and a deflector 48. As explained in more detail hereinbelow, the respective components of the electronic module 10 are positioned in a manner which defines various paths for air flowing through the chassis 12. For reasons of clarity, the paths are shown in a single line format in FIG. 3, and include a first path 50, a second path 52, and a third path 54.

The capacitors 36 are positioned within the chassis 12, and at least one of the capacitors 36 is proximate the first end 14 of the chassis 12. According to various embodiments, the capacitors 36 are electrolytic capacitors. The heat sink 38 is positioned between the capacitors 36 and the bus bars 30. The heat sink 38 may be fabricated from any suitable thermally conductive material. For example, according to various embodiments, the heat sink 38 is fabricated from a metal (e.g., lightweight aluminum) and incorporates a mechanically swagged hollow fin design. The fins are spaced apart from one another, and operate to dissipate heat and stop component debris from passing therebetween. The first switching device 40 is positioned between the heat sink 38 and the third side 22 of the chassis 12. The second switching device 42 is positioned between the heat sink 38 and the third side 22 of the chassis 12, as well as between the first switching device 40 and the second end 16 of the chassis 12. According to various embodiments, the first and second switching devices 40, 42 are implemented as insulated gate bipolar transistor modules and are configured to operate in parallel as one device.

Each capacitor tray 44 is positioned within the chassis 12 between the capacitors 36 and the fourth side 24 of the chassis 12, and may be fabricated from any suitable material (e.g., a plastic). The capacitor tray 44 functions to help support the capacitors 36 in a position away from the fourth side 24 of the chassis 12. The capacitor tray also functions to stop at least a portion of component debris from passing therethrough. According to various embodiments, a given capacitor tray 44 defines one or more openings 56 (see FIG. 4) aligned with corresponding capacitors 36, wherein each opening 56 is sized smaller than a circumference of the corresponding capacitor 36.

Figure 4:
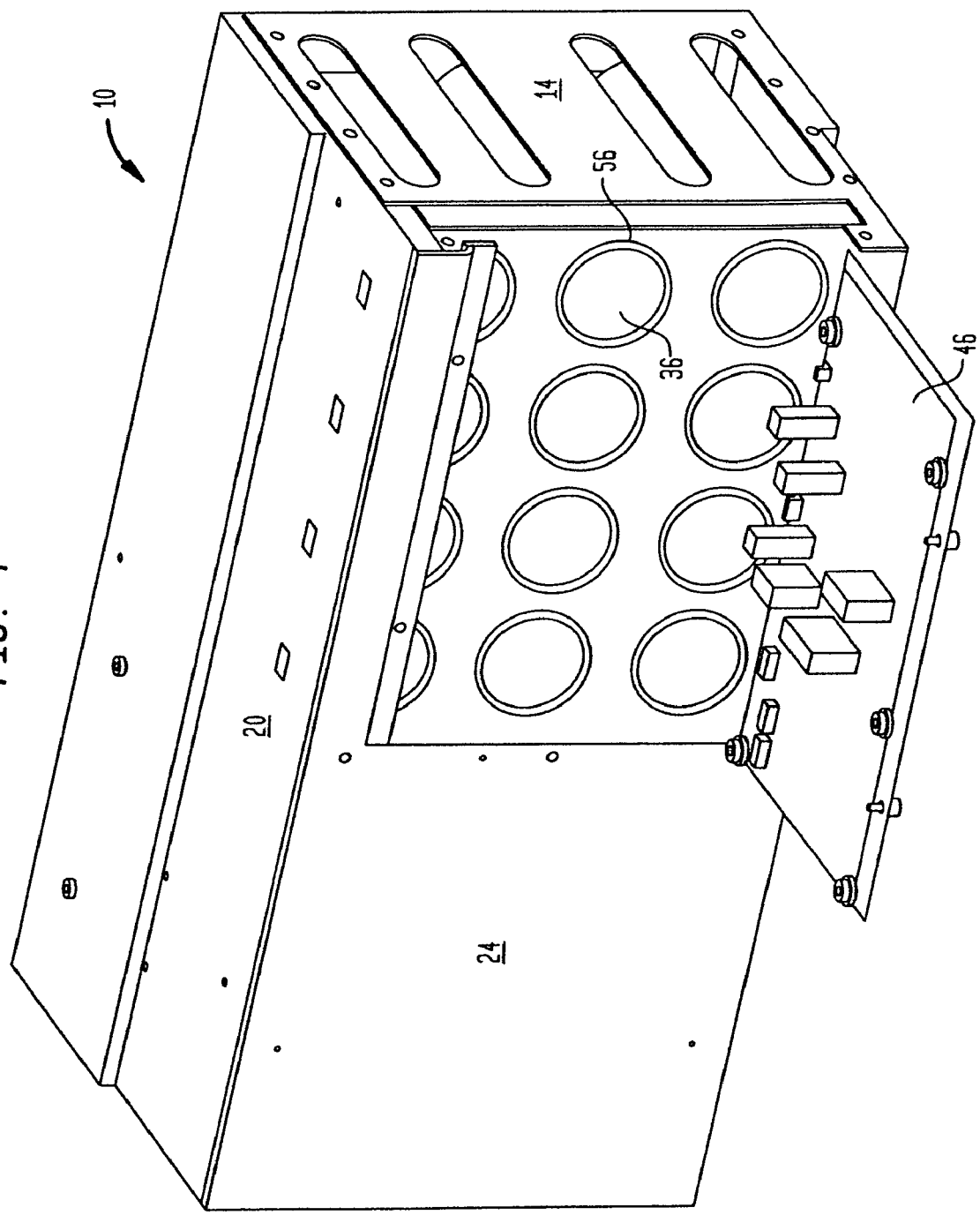
FIG. 4 illustrates various embodiments of the electronic module of FIG. 1 including a control circuit.

The control board 46 is positioned between the capacitor tray 44 and the fourth side 24 of the chassis 12, includes a number of components, and is configured to monitor and/or control the operation of the electronic module 10. For example, according to various embodiments, the control board 46 is configured to control the operation of first and second switching devices 40, 42, control fiber optic communications from the electronic module 10, etc. As shown in FIG. 4, according to various embodiments, the portion of the fourth side 24 of the chassis 12 that the control board 46 is connected to may be hingedly connected to the chassis 12 to allow for easy access to the control board 46.

Returning to FIG. 3, the deflector 48 is positioned between the capacitors 36 and the second end 16 of the chassis 12, as well as between the heat sink 34 and the fourth side 24 of the chassis 12. The deflector 48 may be fabricated from any suitable material. According to various embodiments, the deflector is fabricated from a material (e.g., a metal, a plastic, etc.) having a thickness sufficient to stop at least some of the debris resulting from a failure of an internal component of the electronic module 10 from passing through the deflector 48. The deflector 48 is configured to redirect a portion of air approaching the deflector 48 toward the heat sink 38. Although the deflector 48 is shown in FIG. 3 as having a distinct bend, the functionality of the deflector 48 may be realized with other configurations. As shown in FIG. 3, the deflector 48 defines an opening 58 therethrough. The opening 58 allows air flowing towards the deflector 48 to pass through the opening 58 toward the resistors 34. According to various embodiments, the opening 58 is aligned with the resistors 34.

Figure 5:
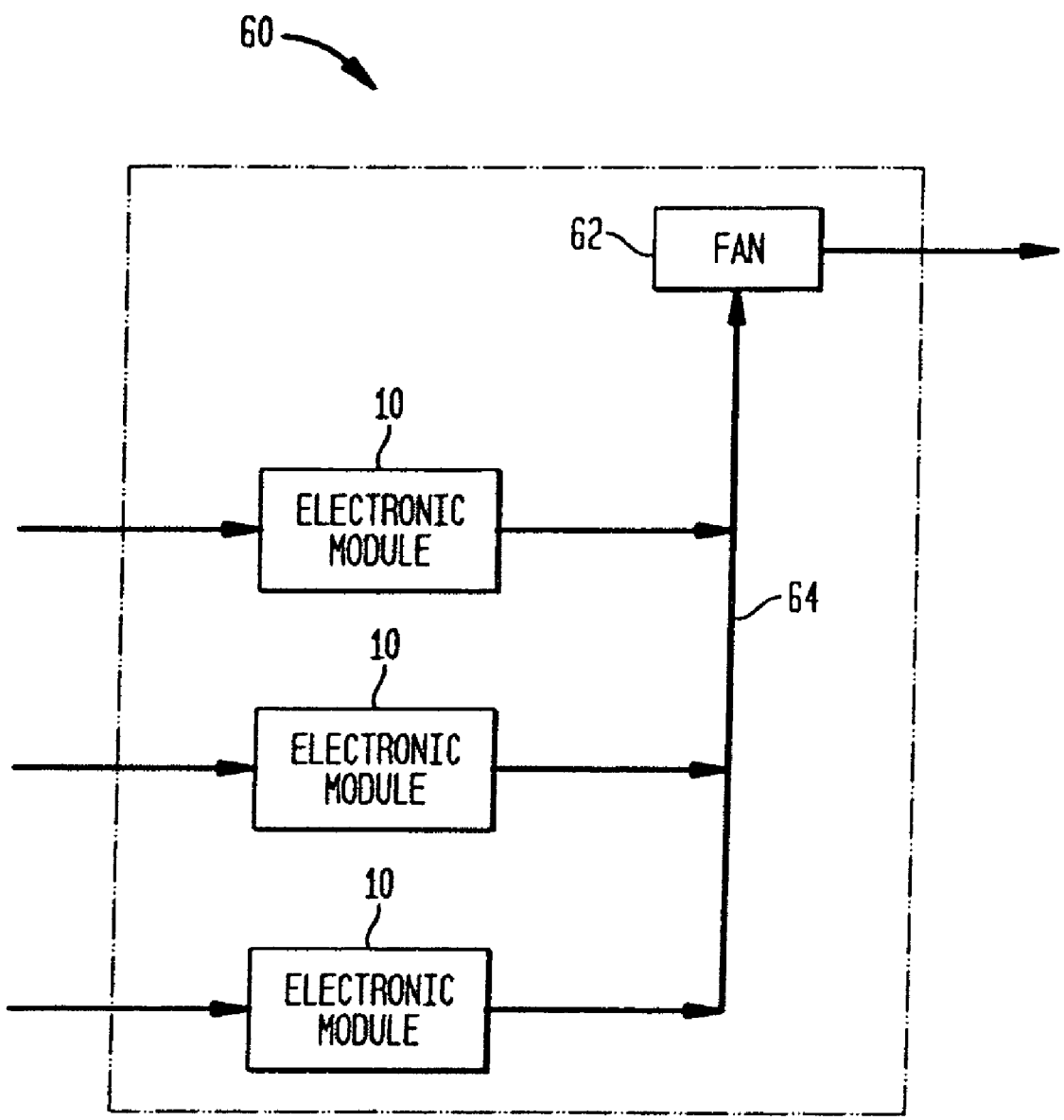
FIG. 5 illustrates various embodiments of a system which includes the electronic module of FIG. 1.

FIG. 5 illustrates various embodiments of a system 60. The system 60 may be utilized in a variety of applications. For example, the system 60 may be utilized as a power supply. The system 60 includes the electronic module 10 of FIG. 1. According to various embodiments, the system 60 may include any number of electronic modules 10. For example, according to various embodiments, the system 60 may include anywhere from one to twenty-four electronic modules 10. For purposes of clarity only three electronic modules 10 are shown in FIG. 5.

The system 60 also includes a fan 62. The fan 62 may be any type of fan suitable for moving air. For example, according to various embodiments, the fan 62 is a backward inclined centrifugal fan. Additionally, the fan 62 may be arranged in any suitable configuration with respect to the electronic modules 10. For example, the fan 62 may be arranged in a draw-thru configuration as shown in FIG. 5. According to other embodiments, the fan 62 may be arranged in a different configuration (e.g., blow-thru). The system 60 may include any number of fans 62. For example, according to various embodiments, the system 60 includes two fans 62. For such embodiments, one of the two fans 62 may be utilized as a redundant fan.

In operation, the fan 62 serves to generate an airflow 64 through the respective electronic modules 10 of the system 60. A first portion of the airflow enters the chassis 12 at the one or more openings 28 defined by the first end 14 and proceeds along the first path 50. As the first portion of the airflow advances along the first path 50 toward the second end 16, the airflow circulates around and comes in contact with the capacitors 36, thereby serving to cool the capacitors 36. After passing the volume proximate the capacitors 36, the first portion of the airflow comes in contact with the heat sink 38 while circulating around and between the fins thereof, thereby serving to dissipate heat from the heat sink 38. Concurrent therewith, the first portion of the airflow also sequentially comes in contact with the first switching device 40 and the second switching device 42, thereby serving to cool the switching devices 40, 42. After passing the volume occupied by the heat sink 38 and the first and second switching devices 40, 42, the first portion of the airflow circulates around and comes in contact with the bus bars 30 and the power plug connectors 32 before exiting the second end 16 of the chassis 12, thereby serving to cool the bus bars 30 and the power plug connectors 32.

Concurrent with the flow of the first portion of the airflow through the chassis 12, a second portion of airflow enters the chassis 12 at the opening 26 defined by the first end 14 and proceeds along the second path 52. As the second portion of the airflow advances along the second path 52 toward the second end 16, the airflow circulates around and comes in contact with the capacitor tray 44, and also comes in contact with portions of the capacitors 36 via the openings 56 defined by the capacitor tray 44, thereby serving to cool the capacitors 36 and the capacitor tray 44. Concurrent therewith, the second portion of the airflow also circulates around and comes in contact with the control board 46, thereby serving to cool the control board 46.

After passing the volume occupied by the capacitor tray 44 and the control board 46, the second portion of the airflow approaches the deflector 48. A portion of the second portion of the airflow passes through the opening 58 defined by the deflector 48, then circulates around and comes in contact with the resistors 34, thereby serving to cool the resistors 34. After passing by the volume occupied by the resistors 34, the portion of the second portion of the airflow may also circulate around and come in contact with the bus bars 30 and the power plug connectors 32 before exiting at the second end 16 of the chassis 12, thereby serving to cool the bus bars 30 and the power plug connectors 32.

When the remaining portion of the second portion of the airflow comes near or in contact with the deflector 48, the remaining portion is deflected along the third path 54 toward the heat sink 38 and the second switching device 42. The remaining portion of the second portion of the airflow comes in contact with the heat sink 38 while circulating around and between the fins thereof, thereby serving to dissipate heat from the heat sink 38. The remaining portion of the second portion of the airflow also comes in contact with the second switching device 42, thereby serving to further cool the switching device 42. The additional cooling of the second switching device 42 by the remaining portion of the second portion of the airflow serves to maintain both of the switching devices 40, 42 at approximately the same temperature. The remaining portion of the second portion of the airflow effectively merges with the first portion of the airflow (i.e., the first and third paths 50, 54 combine with one another) and circulates around and comes in contact with the bus bars 30 and the power plug connectors 32 before exiting at the second end of the chassis 12.

The above-described airflows and the configuration of the electronic module 10 also function to contain any failures which occur within the chassis 12. In general, capacitors are known to overheat and fail in the absence of a sufficient amount of airflow. Some such failures result in the explosion of the capacitor. As the chassis 12 is fabricated from a sufficient thickness of a suitably strong material (e.g., galvanized steel) and encloses substantially the entire electronic module 10, any of the debris resulting from such an explosion which comes in contact with the chassis 12 is not likely to pass through the chassis 12 (e.g., through one of the sides of the chassis). Similarly, any debris resulting from the failure of other components within the chassis 12 of the electronic module 10 (e.g., the control board, the switching devices, the resistors, etc.) which comes in contact with the chassis 12 also is not likely to pass through the chassis 12. Thus, when a failure occurs in a given electronic module 10, the construction of the chassis 12 operates to reduce the chance of the failure damaging any adjacent electronic modules 10.

With the capacitors 36 positioned where they are the first components to come in contact with the first portion of the airflow, the capacitors 36 are exposed to the coolest air of the first portion of the airflow, thereby reducing the chance of overheating. Also, by having a portion of each capacitor exposed to the second portion of the airflow via the openings 56 in the capacitor tray 44, such capacitor portions are also exposed to the coolest air of the second portion of the airflow, thereby reducing the chance of overheating at the respective portions most likely to become overheated. In the event that one of the capacitors 36 does explode, the relatively high volume of airflow will carry the capacitor debris toward the heat sink 38, and the spaced-apart fins of the heat sink 38 will stop a significant portion of such debris from passing therebetween. Any debris which is not blocked by the heat sink 38 will be relatively small and cool, and may nonetheless be blocked from exiting the chassis 12 by the second end 16 of the chassis 12.

By also positioning the control board 46 to receive the coolest air of the second portion of the airflow, the potential for failure of the control board 46 is significantly reduced. In the event that one of the components of the control board 46 does explode, the relatively high volume of airflow will carry the capacitor debris toward the heat sink 38 via the deflector 48, where a significant portion of such debris will be blocked from advancing further. Any debris which is not blocked by the heat sink 38 may nonetheless be blocked from exiting the chassis 12 by the second end 16 of the chassis 12.

As the first and second switching devices 40, 42 may be operated in parallel as a single device, it is advantageous to keep the two switching devices 40, 42 at approximately the same temperature. With the first switching device 40 positioned before the second switching device 42 along the first airflow path 50, the heat transferred from the first switching device 40 to the first portion of airflow results in the second switching device 42 being exposed to somewhat warmer air from the first portion of airflow than the first switching device 40 is. To promote similar cooling of the first and second switching devices 40, 42, the deflector 48 is positioned such that second switching device 42 is also exposed to the airflow from the third airflow path 54.

As air within the chassis 12 may become ionized, the flow of air through the chassis 12 reduces the likelihood of such ionization occurring, thereby reducing the time of, and associated damage resulting from, an electric arc within the chassis 12.

While several embodiments of the invention have been described herein by way of example, those skilled in the art will appreciate that various modifications, alterations, and adaptions to the described embodiments may be realized without departing from the spirit and scope of the invention defined by the appended claims.

What is claimed is:

1. An electronic module, comprising:
a chassis having a first end and a second end opposite the first end, wherein the chassis comprises:
a first side;
a second side opposite the first side;
a third side connected to at least one of the first and second sides; and
a fourth side connected to at least one of the first and second sides, wherein the fourth side is opposite the third side;
a plurality of capacitors positioned within the chassis;
a plurality of bus bars positioned within the chassis and operably connected to the plurality of capacitors, wherein the plurality of bus bars comprises at least one input bus bar and at least one output bus bar;
a plurality of power plug connectors, wherein each of the plurality of bus bars further comprises at least one power plug connector configured to establish a connection between the bus bar and a system bus, thereby operably connecting the electronic module and the system bus; and
a heat sink positioned between the capacitors and the second end, wherein the chassis is fabricated from a material having a thickness and resulting strength such that component debris located within the chassis is prevented from passing through the sides of the chassis, wherein the component debris comprises at least a portion of a failed component positioned within the chassis.

2. The electronic module of claim 1, wherein the material is a metal.

3. The electronic module of claim 2, wherein the metal is galvanized steel.

4. The electronic module of claim 1, wherein a portion of one of the sides is hingedly connected to the chassis.

5. The electronic module of claim 1, wherein at least one of the capacitors is an electrolytic capacitor.

6. The electronic module of claim 1, wherein the heat sink is fabricated from a thermally conductive material.

7. The electronic module of claim 6, wherein the thermally conductive material is aluminum.

8. The electronic module of claim 1, wherein the heat sink comprises spaced-apart fins which stop at least some of the component debris from passing therebetween.

9. The electronic module of claim 1, further comprising a capacitor tray positioned between the capacitors and one of the sides of the chassis, wherein the capacitor tray is fabricated from a material having a thickness and resulting strength such that the capacitor tray stops at least some of the component debris from passing therethrough.

10. The electronic module of claim 9, further comprising a control board positioned between the capacitor tray and one of the sides of the chassis.

11. The electronic module of claim 1, further comprising a deflector positioned between the capacitors and the second end, wherein the deflector is fabricated from a material having a thickness and resulting strength such that the deflector stops at least some of the component debris from passing therethrough.

12. The electronic module of claim 1, further comprising a first switching device positioned between the heat sink and one of the sides of the chassis.

13. The electronic module of claim 12, further comprising a second switching device positioned between the heat sink and the one of the sides of the chassis.

14. The electronic module of claim 1, further comprising a resistor positioned between the deflector and the second end.

15. A system, comprising:
a fan; and
an electronic module, wherein the electronic module comprises:
a chassis having a first end and a second end opposite the first end, wherein the chassis comprises:
a first side;
a second side opposite the first side;
a third side connected to at least one of the first and second sides; and
a fourth side connected to at least one of the first and second sides, wherein the fourth side is opposite the third side;

a plurality of capacitors positioned within the chassis;

a plurality of bus bars positioned within the chassis and operably connected to the plurality of capacitors, wherein the plurality of bus bars comprises at least one input bus bar and at least one output bus bar;

a plurality of power plug connectors, wherein each of the plurality of bus bars further comprises at least one power plug connector configured to establish a connection between the bus bar and a system bus, thereby operably connecting the electronic module and the system bus; and a heat sink positioned between the capacitors and the second end, wherein the heat sink is positioned such that when the fan generates an airflow, the airflow carries component debris located within the chassis toward the heat sink, wherein the component debris comprises at least a portion of a failed component positioned within the chassis.

16. The system of claim 15, wherein the chassis is fabricated from a material having a thickness and resulting strength such that the chassis stops component debris from passing through the sides thereof.

17. The system of claim 15, wherein the heat sink comprises spaced-apart fins which stop at least some of the component debris from passing therebetween.

18. The system of claim 15, wherein the electronic module further comprises a capacitor tray positioned between the capacitors and one of the sides of the chassis, wherein the capacitor tray is fabricated from a material having a thickness and resulting strength such that the capacitor tray stops at least some of the component debris from passing therethrough.

19. The system of claim 18, wherein the electronic module further comprises a control board positioned between the capacitor tray and one of the sides of the chassis.

20. The system of claim 15, wherein the electronic module further comprises a deflector positioned between the capacitors and the second end, wherein the deflector is fabricated from a material having a thickness and resulting strength such that the deflector stops at least some of the component debris from passing therethrough.

* * * * *